United States Patent
Ha et al.

(10) Patent No.: US 11,890,864 B2
(45) Date of Patent: Feb. 6, 2024

(54) APPARATUS FOR SUPPLYING CHEMICAL LIQUID

(71) Applicant: SEMES CO., LTD, Cheonan-si (KR)

(72) Inventors: Inseok Ha, Cheonan-si (KR); Jinhyuck Yang, Daegu (KR); Jaeyoung Jang, Cheonan-si (KR)

(73) Assignee: SEMES CO., LTD, Cheonan-si (KR)

( * ) Notice: Subject to any disclaimer, the term of this patent is extended or adjusted under 35 U.S.C. 154(b) by 152 days.

(21) Appl. No.: 17/366,322

(22) Filed: Jul. 2, 2021

(65) Prior Publication Data

US 2022/0009249 A1    Jan. 13, 2022

(30) Foreign Application Priority Data

Jul. 7, 2020 (KR) .......................... 10-2020-0083381

(51) Int. Cl.
| | | |
|---|---|---|
| *B41J 11/00* | (2006.01) | |
| *B05B 7/06* | (2006.01) | |
| *B05B 13/02* | (2006.01) | |
| *H01L 21/683* | (2006.01) | |

(52) U.S. Cl.
CPC ........... *B41J 11/0085* (2013.01); *B05B 7/061* (2013.01); *B05B 13/02* (2013.01); *H01L 21/6838* (2013.01)

(58) Field of Classification Search
USPC .......................... 118/300, 313, 315, 305, 314
See application file for complete search history.

(56) References Cited

U.S. PATENT DOCUMENTS

2004/0234690 A1 * 11/2004 Hiruma ................. G02F 1/1341
                                                                    427/256
2015/0314325 A1 * 11/2015 Ko ...................... H01L 21/6776
                                                                    427/256

FOREIGN PATENT DOCUMENTS

| JP | 2008298975 A | * 12/2008 | |
| JP | 2011-031143 A | 2/2011 | |
| JP | 2013012754 A | * 1/2013 | .......... B65G 49/061 |
| JP | 2017-515658 A | 6/2017 | |
| KR | 10-2010-0033945 A | 3/2010 | |
| KR | 10-1051767 B1 | 7/2011 | |
| KR | 10-1083814 B1 | 11/2011 | |
| KR | 10-1312333 B1 | 9/2013 | |
| KR | 10-2019-0022080 A | 3/2019 | |
| KR | 10-2019-0048562 A | 5/2019 | |
| KR | 10-1997932 B1 | 7/2019 | |

(Continued)

OTHER PUBLICATIONS

English Translation JP-2013012754 A (Year: 2013).*

(Continued)

*Primary Examiner* — Yewebdar T Tadesse

(74) *Attorney, Agent, or Firm* — DALY, CROWLEY, MOFFORD & DURKEE, LLP

(57) ABSTRACT

An apparatus for supplying a chemical liquid may include a stage on which a substrate is placed, a chemical liquid discharging member and a direction changing member. The chemical liquid discharging member may supply the chemical liquid onto at least two first regions of the substrate for first pixels along a first direction. Additionally, the chemical liquid discharging member may supply the chemical liquid onto at least two second regions of the substrate for second pixels along a second direction. The direction changing member may change a direction of the substrate from the second direction to the first direction.

8 Claims, 5 Drawing Sheets

(56) References Cited

FOREIGN PATENT DOCUMENTS

| | | |
|---|---|---|
| KR | 10-2019-0118999 A | 10/2019 |
| KR | 10-2041321 B1 | 12/2019 |

OTHER PUBLICATIONS

English Translation JP-2008298975 (Year: 2008).*
Japanese Office Action (with Machine English Translation) dated Jun. 30, 2022 for Japanese Application No. 2021-105769; 7 Pages.

* cited by examiner

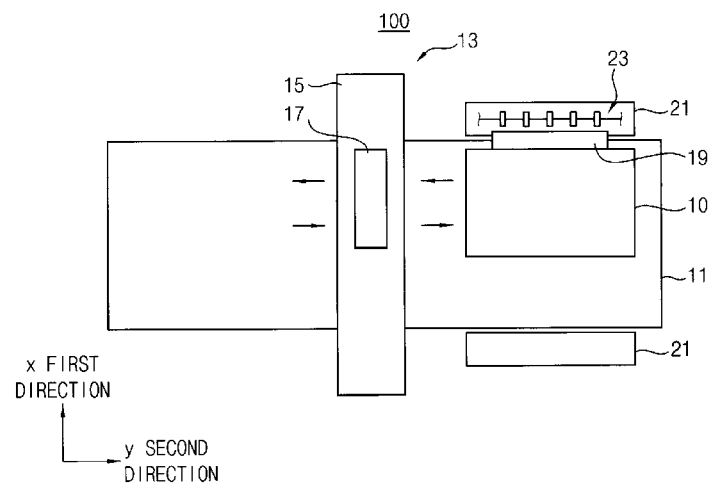
[FIG. 1]
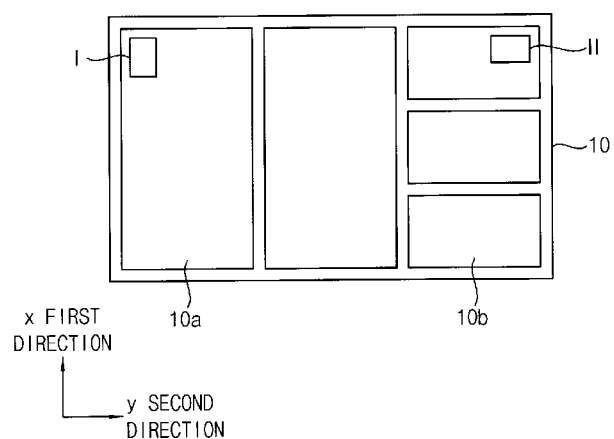
[FIG. 2]

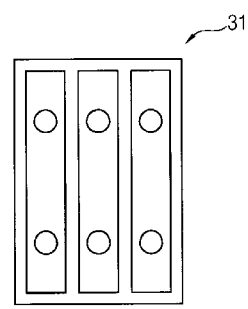
x FIRST DIRECTION
y SECOND DIRECTION
[FIG. 3]
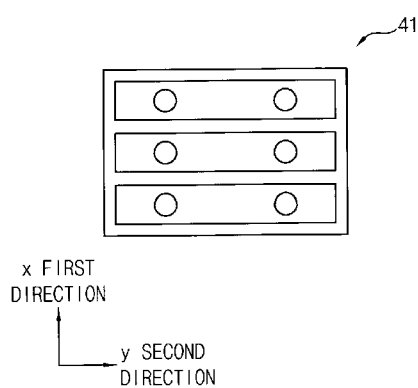
x FIRST DIRECTION
y SECOND DIRECTION
[FIG. 4]
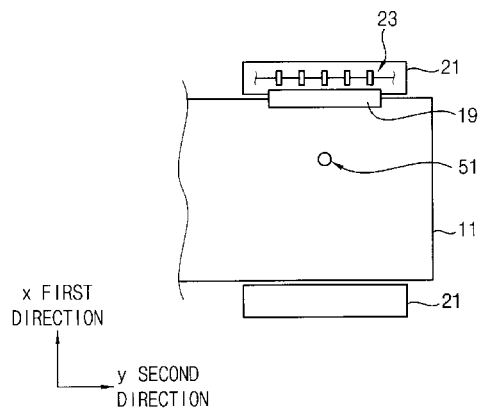
x FIRST DIRECTION
y SECOND DIRECTION
[FIG. 5]

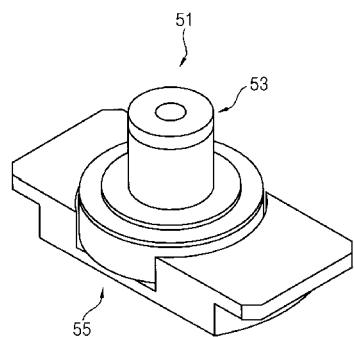
[FIG. 6]
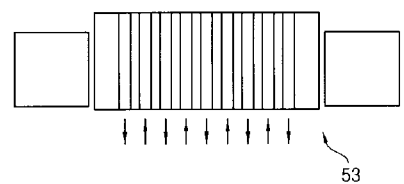
[FIG. 7]
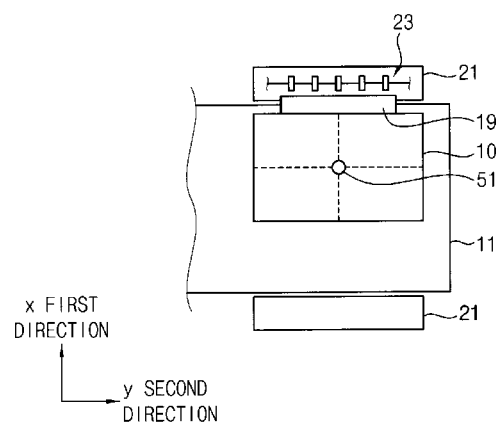
[FIG. 8]

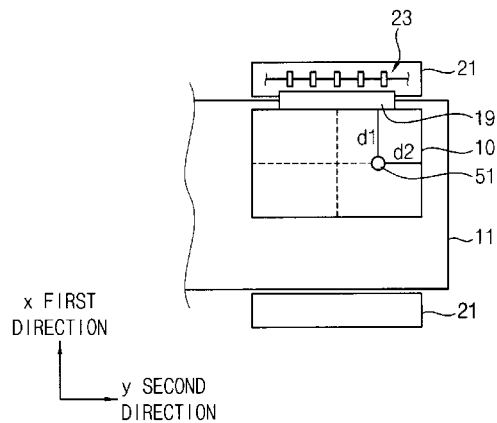
[FIG. 9]
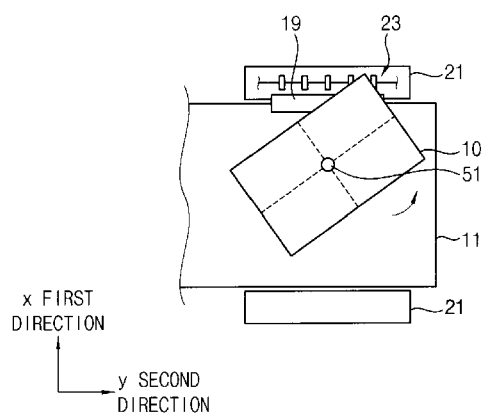
[FIG. 10]
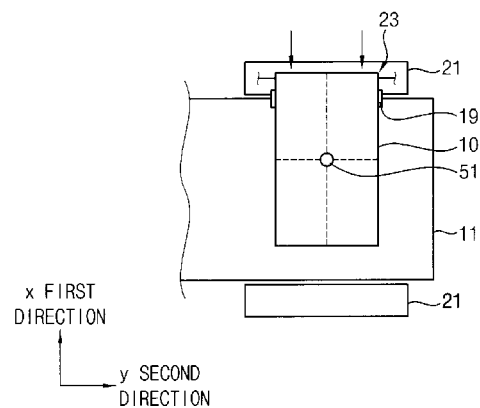
[FIG. 11]

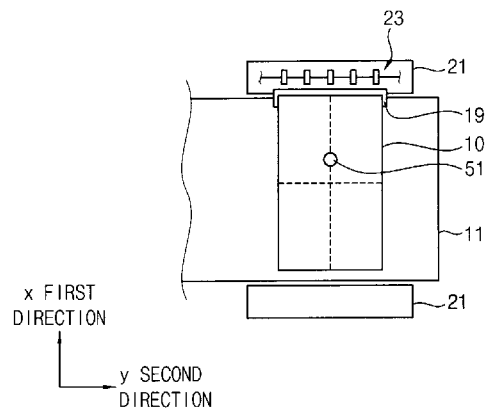
[FIG. 12]
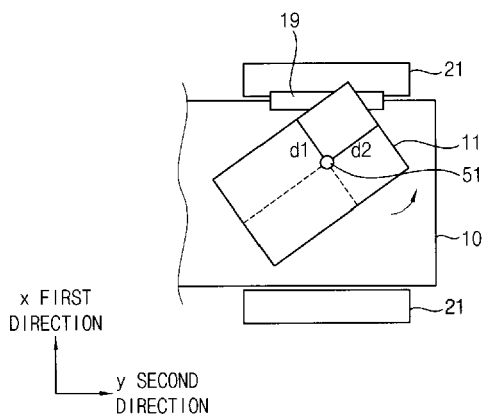
[FIG. 13]
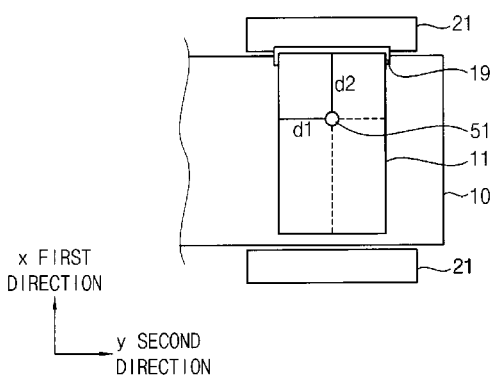
[FIG. 14]

APPARATUS FOR SUPPLYING CHEMICAL LIQUID

CROSS-REFERENCE TO RELATED APPLICATION

This application claims a priority to Korean Patent Application No. 2020-00083381 filed on Jul. 7, 2020 in the Korean Intellectual Property Office (KIPO), the content of which is herein incorporated by reference in their entity.

BACKGROUND

1. Field

Example embodiments of the invention relate to an apparatus for supplying chemical liquid. More particularly, example embodiments of the invention relate to an apparatus for supplying chemical liquid capable of supplying a chemical liquid onto a substrate to form pixels arranged in different directions on the substrate.

2. Related Technology

Recently, dimensions of substrate for manufacturing display devices such as organic light emitting display devices or liquid crystal display device have been increased. In general, a plurality of panels having different sizes can be formed on one substrate in order to obtain more panels from a substrate having large dimensions. For example, panels of about 65 inches and panels of about 32 inches can be simultaneously obtained from one substrate having large dimensions. These panels having different sizes may include pixels arranged in different directions.

To form the pixels arranged in the different directions, a chemical liquid may be supplied onto at least two regions of the substrate. For example, the chemical liquid may be supplied onto at least two regions of the substrate to form the pixels of the panels of about 65 inches and the chemical liquid may be provided onto at least two other regions of the substrate to form the pixels of the panels of about 32 inches.

A conventional apparatus for supplying chemical liquid may include a chemical liquid supply member which can supply a chemical liquid onto a substrate along one direction only. In other words, the conventional chemical liquid supply member may provide the chemical liquid onto the at least two regions of the substrate along the first direction only, or may supply the chemical liquid onto the at least two other regions of the substrate along the second direction only. Therefore, to form the pixels arranged in the different directions on one substrate, it may be required one apparatus for supplying chemical liquid including the chemical liquid supply member capable of supplying the chemical liquid onto the substrate in the first direction and another apparatus for supplying chemical liquid including the chemical liquid supply member capable of supplying the chemical liquid onto the substrate in the second direction. When the panels having different sizes are formed on the substrate using these apparatuses, the configurations of the apparatuses may be complicated and also the cost and time for manufacturing a display device may be increased.

SUMMARY

It is an object of the invention to provide an apparatus for supplying chemical liquid capable of supplying a chemical liquid onto a substrate to form pixels arranged in different directions on the substrate.

According to one aspect of the invention, there is provided an apparatus for supplying a chemical liquid including a stage on which a substrate is placed, a chemical liquid discharging member and direction changing member. The chemical liquid discharging member may supply the chemical liquid onto at least two first regions of the substrate for first pixels along a first direction, and may supply the chemical liquid onto at least two second regions of the substrate for second pixels along a second direction. The direction changing member may change a direction of the substrate from the second direction to the first direction.

In example embodiments, the direction changing member may include a holding member for holding a portion of a bottom of the substrate and a rotating member for rotating the holding member.

In some example embodiments, the holding member provides a vacuum suction to the portion of the bottom of the substrate.

In other example embodiments, the holding member simultaneously provides the vacuum suction and an air injection to the portion of the bottom of the substrate.

In example embodiments, the apparatus for supplying a chemical liquid may additionally include a bending preventing member for preventing an edge portion of the substrate deviated from the state from being bent downwardly when the direction of the substrate is changed.

In some example embodiments, the bending preventing member may provide an air injection to the edge portion of the substrate deviated from the state.

According to another aspect of the invention, there is provided an apparatus for supplying a chemical liquid including a stage, a transferring member, a chemical liquid discharging member and a direction changing member. A substrate having a relatively long side and a relatively short side may be placed on the stage. The transferring member may hold an end portion of the relatively long side of the substrate or an end portion of the relatively short side of the substrate to transfer the substrate. The chemical liquid discharging member may supply the chemical liquid onto at least two first regions of the substrate for first pixels along a first direction, and may supply the chemical liquid onto at least two second regions of the substrate for second pixels along a second direction. The direction changing member may change a direction of the substrate from the second direction to the first direction.

In example embodiments, the direction changing member may include a holding member for providing a vacuum suction to a central portion of a bottom of the substrate and a rotating member for rotating the holding member.

In some example embodiments, the direction changing member may include a holding member for providing a vacuum suction to a peripheral portion of a bottom of the substrate and a rotating member for rotating the holding member. Here, the peripheral portion of the bottom of the substrate may be separated from the relatively long side of the substrate and the relatively long short of the substrate by a same distance.

In other example embodiments, the holding member simultaneously provides the vacuum suction and an air injection to the bottom of the substrate.

In some example embodiments, the apparatus for supplying a chemical liquid may additionally include a positioning member. When the transferring member grips an end portion of the relatively short side of the substrate instead of an end portion of the relatively long side of the substrate, or the end portion of the relatively long side of the substrate instead of the end portion of the relatively short side of the substrate as the substrate rotates, the positioning member may adjust a position of the substrate or a position of the transferring member such that the transferring member grips the end portion of the relatively long side of the substrate or the end portion of the relatively short side of the substrate when the end portion of the relatively long side of the substrate or the end portion of the relatively short side of the substrate deviates from the stage.

In some example embodiments, the positioning member may include a roller contacting the bottom of the substrate such that the substrate moves toward the transferring member.

In other example embodiments, the apparatus for supplying a chemical liquid of may additionally include a bending preventing member for providing an air injection to an edge portion of the substrate deviated so as to prevent the edge portion of the substrate deviated from the state from being bent downwardly when the direction of the substrate is changed.

According to still another aspect of the invention, there is provided an apparatus for supplying a chemical liquid including a floating stage, a transferring member, a chemical liquid discharging member and a direction changing member. The floating stage may float a substrate having a relatively long side and a relatively short side. The transferring member may hold an end portion of the relatively long side of the substrate or an end portion of the relatively short side of the substrate to transfer the substrate. The chemical liquid discharging member may supply the chemical liquid onto at least two first regions of the substrate for first pixels along a first direction, and may supply the chemical liquid onto at least two second regions of the substrate for second pixels along a second direction. The direction changing member may change a direction of the substrate from the second direction to the first direction by holding a peripheral portion of a bottom of the substrate separated from the relatively long side of the substrate and the relatively long short of the substrate by a same distance.

In example embodiments, the transferring member may provide a vacuum suction to a portion of the bottom of the substrate.

In example embodiments, the chemical liquid discharging member may include a gantry and an ink jet head for discharging the chemical liquid onto the substrate transferred over the floating substrate.

In some example embodiments, the direction changing member may include a holding member for providing a vacuum suction to a portion of the bottom of the substrate and a direct coupled motor directly connected to the holding member.

In some example embodiments, the holding member may simultaneously provide the vacuum suction and an air injection to the portion of the bottom of the substrate.

In other example embodiments, the apparatus for supplying a chemical liquid may additionally include a bending preventing member for providing an air injection to an edge portion of the substrate deviated so as to prevent the edge portion of the substrate deviated from the state from being bent downwardly when the direction of the substrate is changed.

According to example embodiments of the invention, the apparatus for supplying chemical liquid may change the direction of the substrate placed on the stage so that the pixels arranged in the different directions may be easily formed on one substrate using only one apparatus for supplying chemical liquid. Additionally, the position of the substrate and/or the position of the transferring member may be adjusted such that the precise alignment between the substrate and the transferring member may be accomplished even though the alignment error may generate between the substrate and the transferring member due to the rotation of the substrate having the substantially rectangular shape. Moreover, the apparatus for supplying chemical liquid may rotate the substrate by the eccentric rotation such that the generation of the alignment error between the substrate and the transferring member may be prevented while rotating the substrate.

BRIEF DESCRIPTION OF THE DRAWINGS

Example embodiments will be more clearly understood from the following detailed description taken in conjunction with the accompanying drawing. The following figures represent non-limiting, example embodiments as described herein.

FIG. 1 is a schematic plan view illustrating an apparatus for supplying chemical liquid in accordance with example embodiments of the invention.

FIG. 2 is a plan view illustrating configuration of a substrate onto which a chemical liquid may be provided from an apparatus for supplying chemical liquid according to example embodiments.

FIG. 3 is an enlarged plan view illustrating a portion "I" of FIG. 2.

FIG. 4 is an enlarged plan view illustrating a portion "II" of FIG. 2.

FIG. 5 is a schematic plan view illustrating a direction changing member of an apparatus for supplying chemical liquid in accordance with example embodiments of the invention.

FIG. 6 is a perspective view illustrating the direction changing member of FIG. 5.

FIG. 7 is a schematic cross-sectional view illustrating a holding member of the direction changing member of FIG. 5.

FIG. 8 is a schematic plan view illustrating an arrangement of a direction changing member in accordance with example embodiments of the invention.

FIG. 9 is a schematic plan view illustrating an arrangement of a direction changing member in accordance with other example embodiments of the invention.

FIGS. 10 to 12 are schematic plan views illustrating a method for changing a direction of a substrate using a direction changing member in accordance with example embodiments of the invention.

FIGS. 13 and 14 are schematic plan views illustrating a method for changing a direction of a substrate using a direction changing member in accordance with other example embodiments of the invention.

DESCRIPTION OF EMBODIMENTS

Various embodiments will be described more fully hereinafter with reference to the accompanying drawings, in which some embodiments are shown. The invention may, however, be embodied in many different forms and should not be construed as limited to the embodiments set forth herein. Rather, these embodiments are provided so that this description will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to"

another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (for example, rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include a plurality of forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the face through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, an apparatus for supplying chemical liquid according to example embodiments of the invention will be described in detail with reference to the accompanying drawings. In the drawings, substantially like or similar elements may be indicated by substantially like or similar reference numerals.

FIG. 1 is a schematic plan view illustrating an apparatus for supplying chemical liquid in accordance with example embodiments of the invention.

Referring to FIG. 1, an apparatus for supplying chemical liquid 100 according to example embodiments may be used to supply a predetermined chemical liquid onto a substrate in processes for manufacturing display devices such as liquid crystal display devices, organic light emitting display devices, etc. For example, the apparatus for supplying chemical liquid 100 may provide the substrate with the chemical liquid in processes for forming the pixels of the display devices.

The apparatus for supplying chemical liquid 100 may include a stage 11, a chemical liquid discharging member 13, a transferring member 19 etc.

A substrate 10 may be disposed on the stage 11 such that the stage 11 may maintain the substrate 10 while the chemical liquid is provided onto the substrate 10. The stage 11 may have dimensions sufficiently larger than those of the substrate 10. For example, the stage has a size for sufficiently accommodating the substrate 10 thereon. Therefore, the stage 11 may stably support the substrate 10 when the substrate 10 is loaded into the apparatus for supplying chemical liquid 100 and when the substrate 10 is rotated by a predetermined angle in the apparatus for supplying chemical liquid 100.

In example embodiments, the chemical liquid may be provided onto the substrate 10 while levitating the substrate 10 over the stage 11. In this case, the stage 11 may apply a predetermined levitation force on the bottom of the substrate 10. For example, the levitation force may be generated using air and/or ultrasonic wave.

In some example embodiments, the substrate 10 may have a precisely controlled height from the surface of the stage 11 while the chemical liquid is supplied onto the substrate 10. That is, the distance between the bottom of the substrate 10 and the surface of the stage 11 may need to be more precisely adjusted in order to exactly provide the chemical liquid onto desired regions of the substrate 10. To this end, the stage 11 may have a configuration for simultaneously providing air injection and vacuum suction onto the bottom of the substrate 10.

As illustrated in FIG. 1, the chemical liquid discharging member 13 may provide the chemical liquid onto the substrate 10 disposed on the stage 11 or levitated over the substrate 11. The chemical liquid discharging member 13 may supply the chemical liquid onto the substrate 10 transferred by the transferring member 19 over the stage 11. For example, the chemical liquid discharging member 13 may be disposed over the substrate 10 moving along the stage 11.

In example embodiments, the chemical liquid discharging member 13 may provide the chemical liquid onto the substrate 10 while the chemical liquid discharging member 13 moves along with the substrate 10. In this case, the chemical liquid discharging member 13 may include a gantry 15 and at least one ink jet head 17 installed on the gantry 15. In some example embodiments, the chemical liquid discharging member 13 may include a plurality of ink jet heads wherein the plurality of ink jet heads may have a plurality of nozzles for spraying the chemical liquid onto the substrate 10.

The gantry 15 may be disposed in a direction substantially perpendicular to a direction in which the substrate 10 is transferred by the transferring member 19. Additionally, the at least one ink jet head 17 may be positioned along a direction substantially the same as the direction where the gantry 15 is disposed. In example embodiments, the at least one ink jet head 17 may supply the chemical liquid onto at least one two regions of the substrate 10 in the direction substantially the same as the direction where the gantry 15 is disposed. Here, the gantry 15 and the at least one ink jet head 17 may be disposed in an x direction (hereinafter, referred to as "a first direction") when the substrate 10 is transferred along a y direction (hereinafter, referred to as "a second direction"). At this time, the at least one ink jet head 17 may spray the chemical liquid onto the at least one two regions of the substrate 10 in the first direction and/or the second direction.

As described above, the apparatus for supplying chemical liquid 100 according to example embodiments may have a configuration in which the chemical liquid discharging member 13 may provide the chemical liquid in the second direction and/or the first direction onto the at least one regions of the substrate 10 being transferred on the stage 11 or over the stage 11 along the first direction.

In other example embodiments, the first direction where the gantry 15 and the at least one ink jet head 17 are disposed may not be substantially perpendicular to the second direction in which the substrate 10 is transferred. For example, the first direction and the second direction may be slanted by a predetermined angle.

Hereinafter, it will be described a configuration of a substrate onto which the chemical liquid may be provided from the apparatus for supplying chemical liquid according to example embodiments.

FIG. 2 is a plan view illustrating configuration of a substrate onto which the chemical liquid may be provided from the apparatus for supplying chemical liquid according to example embodiments. FIG. 3 is an enlarged plan view illustrating a portion "I" of FIG. 2 and FIG. 4 is an enlarged plan view illustrating a portion "II" of FIG. 2.

As illustrated in FIG. 2, the substrate 10 onto which the chemical liquid may be provided from the apparatus for supplying chemical liquid 100 described with reference to FIG. 1 may have a substantially rectangular plane shape. In example embodiments, the substrate 10 may have a rectangular plane shape including a first side having a relatively large length and a second side having relatively small length.

In example embodiments, the substrate 10 may be used to form panels of a display device such as an organic light emitting display device, a liquid crystal display device, etc. To fabricate display devices having various configurations, a plurality of panels having different dimensions may be formed on one substrate rather than a plurality of panels having identical dimensions are formed on one substrate. In this regard, in example embodiments, first panels 10a such as panels of about 65 inches and second panels 10b like panels of about 32 inches may be formed on one substrate 10 using the apparatus for supplying chemical liquid 100. In this case, each of the first panels 10a and the second panels 10b may include a plurality of pixels.

According to example embodiments, a plurality of pixels having different sizes may be formed on the substrate 10 using the apparatus for supplying chemical liquid 100. In other words, various pixels having different dimensions may be formed on the substrate 10 using the apparatus for supplying chemical liquid 100. Here, the pixels may be arranged on the substrate 10 in different directions. For example, as illustrated in FIG. 3, each of the first panels 10a may include a plurality of first pixels 31. Additionally, each of the second panels 10b may include a plurality of second pixels 41. In this case, the first pixels 31 and the second pixels 41 may be arranged along different directions, respectively.

In example embodiments, as illustrated in FIG. 3, the first pixels 31 of the first panels 10a may have a substantially rectangular configuration in which sides having relatively large lengths are disposed in the first direction and the sides having relatively small lengths are disposed along the second direction. Here, the first pixels 31 may include red (R) pixels, green (G) pixels and blue (B) pixels, which are arranged adjacent to each other. In other words, each of the first pixels 31 may be disposed as a pixel unit including a red (R) pixel, a green (G) pixel and a blue (B) pixel arranged adjacent to each other.

In example embodiments, as illustrated in FIG. 4, the second pixels 41 of the second panels 10b may have a substantially rectangular configuration in which sides having relatively large lengths are disposed in the second direction and the sides having relatively small lengths are disposed along the first direction. Similarly, the second pixels 41 may include red (R) pixels, green (G) pixels and blue (B) pixels are arranged adjacent to each other. That is, each of the second pixels 41 may be disposed as a pixel unit including a red (R) pixel, a green (G) pixel and a blue (B) pixel arranged adjacent to each other.

In some example embodiments, each of the first pixels 31 may have a substantially elliptical or a substantially track configuration in which the major axis is disposed in the first direction and the minor axis is disposed in the second direction. In addition, each of the second pixels 41 may have a substantially elliptical or a substantially track configuration in which the major axis is disposed along the second direction and the minor axis is disposed along the second direction.

In other example embodiments, each of the first pixels 31 may have a substantially rhombic configuration in which the major axis is disposed in the first direction and the minor axis is disposed in the second direction. Additionally, each of the second pixels 41 may have a substantially elliptical or a substantially track configuration in which the major axis is disposed along the second direction and the minor axis is disposed along the second direction.

Referring now to FIG. 1, the chemical liquid discharging member 13 may supply the chemical liquid onto the at least two regions of the substrate 10 along the first substrate direction as described above. In example embodiments, the first pixels 31 may be arranged in the first direction so that the chemical liquid discharging member 13 may provide the chemical liquid onto at least two first regions of the substrate 10 for the first pixels 31 along the first direction. Meanwhile, when the chemical liquid is discharged from the chemical liquid discharging member 13 onto at least two second regions of the substrate 10 for the second pixels 41 along the first direction, the chemical liquid may not be exactly supplied onto the at least two second regions because the second pixels 41 may be arranged in the second direction. Therefore, the direction in which the second pixels 41 are arranged may be changed from the second direction to the first direction so as to exactly discharge the chemical liquid onto the second regions of the substrate 10 from the chemical liquid discharging member 13. That is, the direction of the substrate 10 may be changed by the apparatus for supplying chemical liquid 100.

Hereinafter, it will be described a method for changing the direction of the substrate 10 in accordance with example embodiments of the invention.

FIG. 5 is a schematic plan view illustrating a direction changing member of an apparatus for supplying chemical liquid in accordance with example embodiments of the invention. FIG. 6 is a perspective view illustrating the direction changing member of FIG. 5. FIG. 7 is a schematic cross-sectional view illustrating a holding member of the direction changing member of FIG. 5. FIG. 8 is a schematic plan view illustrating a position of direction changing member in accordance with example embodiments of the invention. FIG. 9 is a schematic plan view illustrating a position of direction changing member in accordance with other example embodiments of the invention.

Referring to FIGS. 1 and 5, the apparatus for supplying chemical liquid 100 according to example embodiments may include a direction changing member 51 which can change a direction where the substrate 10 is located.

The direction changing member 51 may convert the substrate 10 placed on the stage 11. For example, the direction changing member 51 may change the arrangement of the second regions of the substrate 10 for the second pixels 41 from the second direction to the first direction.

As illustrated in FIGS. 1, 5 and 6, the direction changing member 51 of the apparatus for supplying chemical liquid 100 may include a holding member 53 and a rotating member 55. In example embodiments, the stage 11 may include a recess structure such that the direction changing member 51 may be accommodated in this recess structure.

The holding member 53 may hold the substrate 10 placed on the stage 11. The rotating member 55 may receive the holding member 53, and then may rotate the holding member 53 together with the substrate 10. For example, the rotating member 55 may have a groove for accommodating the holding member 53 and the holding member 53 may be partially received in the groove structure. In example embodiments, the rotating member 55 may include a direct coupled motor which can be directly connected to the holding member 53 such that the direct coupled motor may apply a predetermined rotating force to the holding member 53.

In example embodiments, the direction changing member 51 may rotate the substrate 10 while partially holding the substrate 10 placed on the stage 11, and thus the direction of the substrate 10 may be changed on the stage 11. For example, the substrate 10 may be rotated so that the arrangement of the second regions of the substrate 10 for the second pixels 41 may be changed from the second direction to the first direction. As described above, the second direction may be substantially perpendicular to the first direction whereas the second direction may be slanted to the first direction by the predetermined angle.

As illustrated in FIG. 7, the holding member 53 may hold the substrate 10 on the stage by a vacuum suction. In example embodiments, the holding member 53 may include a vacuum pump capable of applying a predetermined suction force to a bottom of the substrate 10. When the holding member 53 holds the substrate 10 by only applying the suction force to the bottom of the substrate 10, the bottom of the substrate 10 may be damaged.

In some example embodiments, the holding member 53 may hold the substrate 10 by simultaneously providing a vacuum suction and an air injection to the bottom of the substrate 10. Therefore, the holding member 53 may stably hold the substrate 10 by the vacuum suction and the air injection without any damage to the bottom of the substrate 10. To this end, the holding member 53 may include a vacuum pump capable of applying a predetermined suction force to the bottom of the substrate 10 and an air compressor capable of applying a predetermined jet force to the bottom of the substrate 10.

If the substrate 10 has large dimensions, the stage 11 also has a large size for sufficiently receiving the substrate 10 so that such a stage 11 may not easily rotated to change the direction of the substrate 10. In example embodiments, the substrate 10 may be rotated using the direction changing member 51 disposed on the stage 11 rather than the direction of the substrate 10 is changed by rotating the stage 11 on which the substrate 10 is placed. Therefore, the direction of the substrate 10 on the stage 11 may be easily changed by the direction changing member 51.

In some example embodiments, if the stage 11 is a floating stage, the direction of the substrate 10 may be changed by the direction changing member 51 while injecting an air to the bottom of the substrate 10 except the portion of the substrate 10 held by the holding member 53 when the direction of the substrate 10 is changed over such a stage 11. In other words, the stage 11 may apply the air injection and the vacuum suction to the bottom of the substrate when the chemical liquid is supplied onto the substrate 10 from the chemical liquid discharging member 13, however, the stage 11 may provide the air injection only to change the direction of the substrate 10 when the substrate 10 is rotated over the stage 11 so as to prevent the substrate 11 being bent downwardly.

According to example embodiments, the apparatus for supplying chemical liquid 100 may provide the chemical liquid onto the at least two first regions of the substrate 10 for the first pixels 31 along the first direction, and then may supply the chemical liquid onto the at least two second regions of the substrate 10 for the second pixels 41 along the first direction after the direction of the substrate 10 is converted from the second direction to the first direction. Therefore, the panels of different sizes including the pixels arranged in the different directions may be obtained from one substrate using only one apparatus for supplying chemical liquid. As a result, the apparatus for supplying chemical liquid may have a simple configuration and also the cost and the time for manufacturing a display device may be reduced.

According to the invention, the position of the direction changing member 51 of the apparatus for supplying chemical liquid 100 may be changed with respect to the stage 11 and/or the substrate 10. FIG. 8 is a schematic plan view illustrating an arrangement of a direction changing member in accordance with example embodiments of the invention. FIG. 9 is a schematic plan view illustrating an arrangement of a direction changing member in accordance with other example embodiments of the invention.

Referring to FIG. 8, a direction changing member 51 may hold a central portion of a bottom of a substrate 10 placed on a stage 11. If the substrate 10 has a substantially rectangular plane shape, the central portion of the bottom of the substrate 10 may be a portion in which lines connecting centers of relatively long sides faced each other intersect with lines connecting centers of relatively short sides faced each other. In other words, the central portion of the substrate 10 may be a portion where one line connecting two corners of the substrate 10 faced each other intersects with the other line connecting two corners of the substrate 10 faced each other.

The direction changing member 51 may hold the central portion of the bottom of the substrate 10 in a vacuum suction manner. To this end, the direction changing member 51 may include a holding member 53 disposed on a portion of the stage 11 facing the central portion of the bottom of the substrate 10, and a rotating member 55 for rotating the holding member 53.

In example embodiments, the direction changing member 51 may be disposed on a portion of the stage 11 on which the substrate 10 is loaded from an outside. Alternatively, the direction changing member 51 may be disposed on a preset portion of the stage 11 on which the substrate 10 is placed after a chemical liquid is provided onto first regions of the substrate 10 for first pixels.

As illustrated in FIG. 9, a direction changing member 51 may hold a peripheral portion of a bottom of a substrate 10 placed on a stage 11. When the substrate 10 has the substantially rectangular plane shape, the peripheral portion of the bottom of the substrate 10 may be a portion separated by a predetermined distance from the portion where the lines connecting the centers of the relatively long sides faced each other intersect with the lines connecting the centers of the relatively short sides faced each other. For example, the peripheral portion of the bottom of the substrate 10 may be a portion in which a first distance d1 separated from the relatively long sides of the substrate 10 is substantially equal to a second distance d2 separated from the relatively short sides of the substrate 10. Here, the peripheral portion of the substrate 10 may be positioned on the line connecting the centers of the relatively long sides faced each other.

The direction changing member 51 may hold the central portion of the bottom of the substrate 10 in the vacuum suction manner. Therefore, the direction changing member 51 may include a holding member 53 disposed on a portion of the stage 11 facing the central portion of the bottom of the substrate 10, and a rotating member 55 for rotating the holding member 53.

The direction changing member 51 may be disposed on a portion of the stage 11 on which the substrate 10 is loaded from an outside. Alternatively, the direction changing member 51 may be disposed on a preset portion of the stage 11 on which the substrate 10 is placed after a chemical liquid is provided on to first regions of the substrate 10 for first pixels.

As described above, the direction changing member 51 of the apparatus for supplying chemical liquid 100 may hold the central portion of the bottom of the substrate 10 or the peripheral portion of the bottom of the substrate 10.

In example embodiments, the direction changing member 51 of the apparatus for supplying chemical liquid 100 may have a configuration which may be fixed to a portion of the stage 11, or may be operated over the stage 11 when the direction of the substrate 10 is changed. In other example embodiments, if the stage 11 is the floating stage, the direction changing member 51 may be fixed to a portion of the stage 11, may be controlled to simultaneously apply a vacuum suction and an air injection to the bottom of the substrate 10 when the chemical liquid is supplied onto the substrate 10, and may ne controlled to apply a vacuum suction only or simultaneously apply a vacuum suction and an air injection to the bottom of the substrate when the direction of the substrate 10 is changed. In this case, a suction force and a jet force applied to the bottom of the substrate 10 from the direction changing member 51 may be substantially the same as a suction force and a jet force applied to the bottom of the substrate 10 from the floating stage.

Referring now to FIG. 1, the apparatus for supplying chemical liquid 100 may include the transferring member 19 capable of transferring the substrate 10 on or over the stage 11. For example, the transferring member 19 may transfer the substrate 10 over the stage 11 along the second direction. In this case, the transferring member 19 may grip an end portion of the substrate 10. In example embodiments, the transferring member 19 may move the substrate 10 over the stage 11 while holding an end portion of the relatively long side of the substrate 10 or an end portion of the relatively short side of the substrate 10.

In example embodiments, the transferring member 19 may include a guide rail, a gripping member, a driving member, etc. The guide rail may be disposed on a portion of the stage 11 along the second direction, the gripping member may grip the end portion of the substrate 10, and the driving member may move the gripping member along the guide rail. For example, the gripping member may hold the end portion of the substrate 10 in a vacuum suction manner.

If the substrate 10 has the substantially rectangular shape, the transferring member 19 may hold the end portion of the relatively long side of the substrate 10 or the end portion of the relatively short side of the substrate 10 in a process for providing the chemical liquid onto the substrate 10 using the apparatus for supplying chemical liquid 100. When the direction of the substrate 10 is changed, the end portion of the relatively long side of the substrate 10 or the end portion of the relatively short side of the substrate 10 may deviate from the transferring member 19. In other words, as the substrate 10 rotates, the end portion of the relatively short side of the substrate 10 may deviate from the transferring member 19 when the transferring member 19 grips the end portion of the relatively short side of the substrate 10 instead of the end portion of the relatively long side of the substrate 10. Otherwise, as the substrate 10 rotates, the end portion of the relatively long side of the substrate 10 may deviate from the transferring member 19 when the transferring member 19 holds the end portion of the relatively long side of the substrate 10 instead of the end portion of the relatively short side of the substrate 10.

In example embodiments, the apparatus for supplying chemical liquid 100 may include a positioning member 23 capable of adjusting a position of the substrate 10 and/or a position of the transferring member 19. The positioning member 23 may enable the transferring member 19 hold again the end portion of the substrate 10 in case that the substrate 10 deviates the transferring member 19 due to the change of the direction of the substrate 10. For example, the positioning member 23 may adjust the alignment between the substrate 10 and the transferring member 19 such that the transferring member 19 may exactly grip the end portion of the relatively long side of the substrate 10 or the end portion of the relatively short side of the substrate 10 when the end portion of the relatively long side of the substrate 10 or the end portion of the relatively short side of the substrate 10 deviates from the transferring member 19 as the substrate 10 rotates.

The positioning member 23 may move the end portion of the relatively long side of the rotated substrate 10 or the end portion of the relatively short side of the rotated substrate 10 toward the transferring member 19. For example, the positioning member 23 may include a rotating roller which can contact the bottom of the substrate 10 and move the substrate 10 toward the transferring member 19. The end portion of the relatively long side of the rotated substrate 10 or the end portion of the relatively short side of the rotated substrate 10 may locate an outside of an end portion of the stage 11 so that the positioning member 23 may be disposed the outside of the end portion of the stage 11. The positioning member 23 may adjust the positioning of the substrate 10 and/or the position of the transferring member 19 so that a precise alignment between the substrate 10 and the transferring member 19 may be accomplished even though an alignment error generates between the substrate 10 and the transferring member 19 as the substrate 10 rotates.

Particularly, when the substrate 10 has the substantially rectangular shape, an edge portion of the substrate 10 may frequently deviate from the stage 11 as the direction of the substrate 10 changes. Since the air injection may not be provided from the stage 11 to such an edge portion of the substrate 10 deviated from the stage 11, the edge portion of the substrate 10 may be bent downwardly, and thus cracks may generate from the edge portion of the substrate 10. In example embodiments, the apparatus for supplying chemical liquid 100 may include a bending preventing member 21 which may prevent the edge portion of the substrate 10 deviated from the stage 11 from being bent downwardly.

The bending preventing member 21 may apply an air to the edge portion of the substrate 10 deviated from the stage 11 when the direction of the substrate 10 is changed. In example embodiments, one bending preventing member 21 may be disposed at one end portion of the stage 11. In other example embodiments, two bending preventing members 21 may be disposed both end portions of the stage 11. The downward bending of the edge portion of the substrate 10 may be prevented by the bending preventing member 21 while rotating the substrate 10 such that damage to the substrate 10 or the generation of cracks in the substrate 10 may be effectively prevented.

Hereinafter, it will be described a method of discharging a chemical liquid using the apparatus for supplying chemical liquid according to example embodiments of the invention.

A method of discharging the chemical liquid using the apparatus for supplying chemical liquid 100 in FIG. 8 which may include the direction changing member 51 capable of holding the central portion of the bottom of the substrate 10.

FIGS. 10 to 12 are schematic plan views illustrating a method for changing a direction of a substrate using a direction changing member in accordance with example embodiments of the invention.

Referring to FIGS. 8 and 10, the substrate 10 may be loaded onto the stage 11 of the apparatus for supplying chemical liquid 100 from an outside. The loading of the substrate 10 may be accomplished using a robot arm capable of supporting the bottom of the substrate 10.

The substrate 10 placed on the stage 11 may be supported by supporting pins protruded upwardly from the stage 11. Here, the robot arm may be controlled to move between the supporting pins. As the supporting pins move downwardly into the stage 11, a process of aligning the position of the substrate 10 disposed on the stage 11 may be performed.

After the position of the substrate 10 is aligned, the transferring member 19 may hold the end portion of the relatively long side of the substrate 10 as illustrated in FIG. 8. If the stage 11 is the floating stage, the vacuum suction and the air injection may be applied from the stage 11 to the bottom of the substrate 10, and also the vacuum suction and the air injection may be applied from the direction changing member 51 to the bottom of the substrate 10.

The substrate 10 may be moved under the chemical liquid discharging member 13 by the transferring member 19, and then the chemical liquid may be supplied from the chemical liquid discharging member 13 onto the at least two first regions of the substrate 10 for the first pixels 31 along the first direction. After the chemical liquid is discharged on the first regions for the first pixels 31, the substrate 10 may be moved to an initial position or a preset position on the stage 11 by the transferring member 19.

Referring to FIGS. 10 and 11, the direction changing member 51 may hold the central portion of the bottom of the substrate 10, and then the direction of the substrate 10 may be changed from the second direction to the first direction. When the stage 11 is the floating stage, the air injection may be provided from the stage 11 to the bottom of the substrate 10.

When the direction of the substrate 10 is changed, the edge portion of the substrate 10 may deviate from the stage 11 so that the air injection may be applied from the bending preventing member 21 to the edge portion of the substrate 10 deviated from the stage 11. As the substrate 10 rotates, the transferring member 19 may hold the end portion of the relatively short side of the substrate 10 instead of the end portion of the relatively long side of the substrate 10 while the end portion of the relatively long side of the substrate 10 may deviate from the transferring member 19.

Referring to FIG. 12, the position of the substrate 10 may be adjusted by the positioning member 23 such that the end portion of the relatively short side of the substrate 10 may be located on the transferring member 19. Therefore, the end portion of the relatively short side of the substrate 10 may be held by the transferring member 19.

After the substrate 10 is moved under the chemical liquid discharging member 13 by the transferring member 19, the chemical liquid may be provided from the chemical liquid discharging member 13 onto the at least two second regions of the substrate 10 for the second pixels 41 along the first direction. Similarly, when the stage 11 is the floating stage, the vacuum suction and the air injection may be applied from the stage 11 to the bottom of the substrate 10, and also the vacuum suction and the air injection may be provided from the direction changing member 51 to the bottom of the substrate 10.

The method of discharging the chemical liquid may be completed by unloading the substrate 10 from the stage 11 to the outside using the supporting pins and the robot arm.

A method of discharging the chemical liquid using the apparatus for supplying chemical liquid 100 in FIG. 9 which may include the direction changing member 51 capable of holding the peripheral portion of the bottom of the substrate 10. Here, the peripheral portion of the bottom of the substrate 10 may be the portion where the first distance d1 separated from the relatively long sides of the substrate 10 is substantially equal to the second distance d2 separated from the relatively short sides of the substrate 10.

FIGS. 13 and 14 are schematic plan views illustrating a method for changing a direction of a substrate using a direction changing member in accordance with other example embodiments of the invention.

Referring to FIGS. 9 and 13, after supplying the chemical liquid onto the first regions of the substrate 10 for the first pixels 31, the direction of the substrate 10 may be changed by the direction changing member 51 capable of holding the peripheral portion of the bottom of the substrate 10.

Referring to FIG. 14, when the direction changing member 51 holds the portion in which the first distance d1 separated from the relatively long sides of the substrate 10 is substantially equal to the second distance d2 separated from the relatively short sides of the substrate 10, the end portion of the relatively short side of the substrate 10 may be located over the transferring member 19 instead of the end portion of the relatively long side of the substrate 10. In other words, when the direction of the substrate 10 changed by a eccentric rotation centering the portion in which the first distance d1 separated from the relatively long sides of the substrate 10 is substantially equal to the second distance d2 separated from the relatively short sides of the substrate 10, the end portion of the relatively short side of the substrate 10 may be located directly over the transferring member 19 instead of the end portion of the relatively long side of the substrate 10.

As described above, when the direction changing member 51 may hold the portion in which the first distance d1 separated from the relatively long sides of the substrate 10 is substantially equal to the second distance d2 separated from the relatively short sides of the substrate 10, the end portion of the relatively short side of the substrate 10 may be located directly over the transferring member 19 instead of the end portion of the relatively long side of the substrate 10 so that the positioning member 23 may be omitted.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. An apparatus for supplying a chemical liquid comprising: a stage on which a substrate is placed; a chemical liquid discharging member for supplying the chemical liquid onto at least two first regions of the substrate for first pixels along a first direction and for supplying the chemical liquid onto at least two second regions of the substrate for second pixels along a second direction; a direction changing member for changing a direction of the substrate from the second direction to the first direction; wherein the direction changing member includes a holding member for holding a portion of a bottom of the substrate and a rotating member for rotating the holding member; wherein the holding member provides a vacuum suction to the portion of the bottom of the substrate; and wherein the holding member simultaneously provides the vacuum suction and an air injection to the portion of the bottom of the substrate.

2. The apparatus for supplying a chemical liquid of claim 1, further comprising a bending preventing member for preventing an edge portion of the substrate deviated from the state from being bent downwardly when the direction of the substrate is changed.

3. The apparatus for supplying a chemical liquid of claim 2, wherein the bending preventing member provides an air injection to the edge portion of the substrate deviated from the state.

4. An apparatus for supplying a chemical liquid comprising: a stage on which a substrate having a relatively long side and a relatively short side is placed; a transferring member for holding an end portion of the relatively long side of the substrate or an end portion of the relatively short side of the substrate to transfer the substrate; a chemical liquid discharging member for supplying the chemical liquid onto at least two first regions of the substrate for first pixels along a first direction and for supplying the chemical liquid onto at least two second regions of the substrate for second pixels along a second direction; a direction changing member for changing a direction of the substrate from the second direction to the first direction; wherein the direction changing member includes a holding member for providing a vacuum suction to a central or peripheral portion of a bottom of the substrate and a rotating member for rotating the holding member; and wherein the holding member simultaneously provides the vacuum suction and an air injection to the bottom of the substrate.

5. The apparatus for supplying a chemical liquid of claim 4, wherein the peripheral portion of the bottom of the substrate is separated from the relatively long side of the substrate and the relatively long short of the substrate by a same distance.

6. The apparatus for supplying a chemical liquid of claim 4, further comprising a positioning member wherein when the transferring member grips an end portion of the relatively short side of the substrate instead of an end portion of the relatively long side of the substrate, or the end portion of the relatively long side of the substrate instead of the end portion of the relatively short side of the substrate as the substrate rotates, the positioning member adjusts a position of the substrate or a position of the transferring member such that the transferring member grips the end portion of the relatively long side of the substrate or the end portion of the relatively short side of the substrate when the end portion of the relatively long side of the substrate or the end portion of the relatively short side of the substrate deviates from the stage.

7. The apparatus for supplying a chemical liquid of claim 6, wherein the positioning member includes a roller contacting the bottom of the substrate such that the substrate moves toward the transferring member.

8. The apparatus for supplying a chemical liquid of claim 4, further comprising a bending preventing member for providing an air injection to an edge portion of the substrate deviated so as to prevent the edge portion of the substrate deviated from the state from being bent downwardly when the direction of the substrate is changed.

* * * * *